(12) United States Patent
Adkisson et al.

(10) Patent No.: US 7,719,118 B2
(45) Date of Patent: May 18, 2010

(54) SEMICONDUCTOR CHIP SCALE PACKAGE INCORPORATING THROUGH-VIAS ELECTRICALLY CONNECTED TO A SUBSTRATE AND OTHER VIAS THAT ARE ISOLATED FROM THE SUBSTRATE, AND METHOD OF FORMING THE PACKAGE

(75) Inventors: James W. Adkisson, Jericho, VT (US); Jeffrey P. Gambino, Westford, VT (US); Mark D. Jaffe, Shelburne, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/838,917

(22) Filed: Aug. 15, 2007

(65) Prior Publication Data

US 2009/0045502 A1   Feb. 19, 2009

(51) Int. Cl.
 *H01L 23/48* (2006.01)
 *H01L 23/52* (2006.01)
 *H01L 29/40* (2006.01)

(52) U.S. Cl. .............. 257/778; 257/774; 257/E23.021; 438/108; 438/667

(58) Field of Classification Search ................. 257/690, 257/774, 621, E21.579, E23.015, E23.02, 257/E23.023, 778, 737, 738, E23.021; 438/629, 438/637, 639, 640, 667, 668, 672, 675, 700, 438/701, 713, 978, 108, 613
See application file for complete search history.

(56) References Cited

U.S. PATENT DOCUMENTS 5,227,316 A * 7/1993 Vora et al. ................... 438/655

OTHER PUBLICATIONS

Lieb, et al., "New Wafer-Level-Packaging Technology Using Silicon-Via-Contacts For Optical and Other Sensor Applications", 2004 Electronic Components and Technology Conference; pp. 843-847.

* cited by examiner

*Primary Examiner*—Charles D Garber
*Assistant Examiner*—Dilinh P Nguyen
(74) *Attorney, Agent, or Firm*—Scully, Scott, Murphy & Presser, P.C.; Richard M. Kotulak, Esq.

(57) ABSTRACT

A semiconductor chip scale package formed with through-vias, which can be either isolated or electrically connected to a substrate, and a method of producing the semiconductor chip scale package with through-vias, which can be isolated or electrically connected to the substrate.

6 Claims, 2 Drawing Sheets

SEMICONDUCTOR CHIP SCALE PACKAGE INCORPORATING THROUGH-VIAS ELECTRICALLY CONNECTED TO A SUBSTRATE AND OTHER VIAS THAT ARE ISOLATED FROM THE SUBSTRATE, AND METHOD OF FORMING THE PACKAGE

BACKGROUND OF THE INVENTION

1. Field of the Invention

The present invention relates to the provision of a semiconductor chip scale package with through-vias which can be either isolated or electrically connected to a substrate. Moreover, the invention also relates to a method of producing a semiconductor chip scale package with through-vias which can be isolated or electrically connected to a substrate.

2. Discussion of the Prior Art

In the present state-of-the-art technology, semiconductor chip scale packages are installed in ever increasing numbers in diverse applications into portable devices, for example, such as cell phones, PDAs and cameras, among others. Generally, semiconductor chip scale packages for CMOS image sensors are adapted to be in electrical contact from the backside of a wafer in order to prevent any damage being encountered by a microlens, which is normally arranged on the frontside of the wafer. Provision is made for the presence of through-vias, which are employed in order to be able to facilitate the making of electrical contact with bond pads, generally also employing a dielectric in order to isolate the through-vias from the substrate. However, to an increasing extent, in various physical and commercial applications and installations, it is desirable to have some of the vias in electrical contact with the substrate. Thus, for instance, pursuant to specific example, a method which is employed in order to minimize electrical cross-talk in CMOS imager arrays resides in the utilization of an n-type silicon substrate; in effect, a doped silicon material, while forming the photodiode in a p-type epi layer. Hereby, the n-type silicon layer must be biased in order to capture deep photo-carriers, whereby it is necessary to provide for a contact thereof with a substrate. However, currently the technology does not permit for the formation of through-vias which are isolated from the substrate in some regions and which are electrically connected to the substrate in other regions.

At this time, the prior art is represented and described in connection with semiconductor chip scale packages in an article by Jürgen Leib and Michael Töpper, entitled "New Wafer-Level-Packaging Technology Using Silicon-Via-Contacts for Optical and Other Sensor Applications"; 2004 Electronic Components and Technology Conference of the IEEE; Pages 843-847. In that instance, although basic consideration is given to the provision of silicon via contacts, which are employed for optical and other sensor applications, there is no disclosure provided for having various though-vias electrically contacting a substrate or, alternatively, other vias being isolated from the substrate within the same semiconductor chip scale package.

SUMMARY OF THE INVENTION

Accordingly, in order to improve upon the foregoing technology, pursuant to the present invention, there is provided an arrangement in the formation of semiconductor chip scale packages, which facilitates the formation of through-vias, which are electrically connected to the substrate in various regions, whereas other through-vias are isolated from the substrate in other regions of the package. Moreover, in various instances, for through-vias, which are to be isolated from the substrate, the contact opening may be smaller than the through-via opening; whereas for through-vias, which are connected to the substrate, the contact opening may be larger than the substrate through opening, thereby exposing the sidewall of the silicon substrate.

Moreover, in order to ensure that ohmic contact is achieved between the through-via and the silicon substrate, particularly for electrical contact the width and the n-substrate, wherein this is basically a doped silicon material, as is well known in the technology, an n+ epi layer may be deposited prior to the deposition of a p– epi layer ensuring the ohmic contact with the substrate.

Accordingly, in order to distinguish over the art, it is an object of the present invention to provide a semiconductor chip scale package possessing through-vias, which can be selectively either isolated from or electrically connected to a silicon substrate.

Furthermore, another object of the present invention resides in the provision of a semiconductor chip scale package, which provides for through-vias which are isolated from a silicon substrate, and further through-vias which are electrically in contact with the silicon substrate, and wherein deep trench isolation is provided for between a silicon p– epi layer and the electrical contact.

BRIEF DESCRIPTION OF THE DRAWINGS

Reference may now be made to the following detailed description of preferred embodiments of the invention, taken in conjunction with the accompanying drawings; in which.

DETAILED DESCRIPTION OF THE PREFERRED EMBODIMENTS

Figure 1:
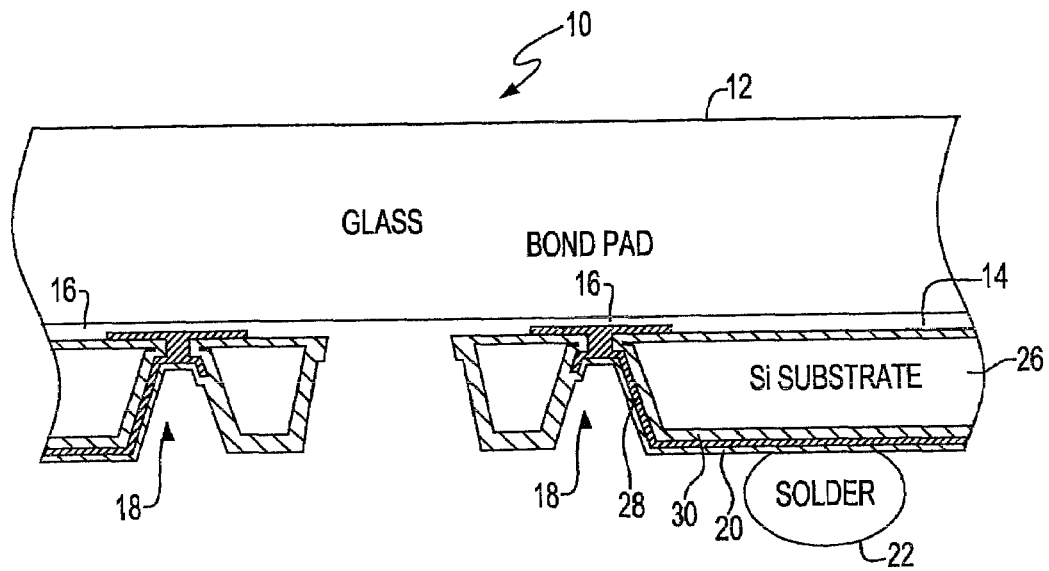
FIG. 1 illustrates a generally diagrammatic representation of a segment of a semiconductor chip scale package possessing though-vias which are isolated from a silicon substrate in accordance with the prior art.

Referring, in particular, to FIG. 1 of the drawings, there is represented diagrammatically a segment of a semiconductor chip scale package 10 pursuant to the prior art, for example, as represented in the above-referenced article by Jürgen Leib, et al. The package 10 comprises a cover glass plate structure 12 having a layer 14 of a dielectric material, which is provided on one side thereof. The layer 12 is shown incorporating bond pads 16, which, in turn, are connected by means of electrically conductive through-vias 18 and backside wires 20 to solder balls 22 or C4 connects.

Arranged between the layer 12 containing the bond pads 16 and the solder balls 22 is a silicon substrate 26, wherein a first dielectric layer 28 is arranged on one side of the backside wire 20, and a further dielectric 30 is arranged on the opposite side of the wire 20, which connects to the through-vias 18, which, in turn, are electrically connected to the bond pads 16; with the substrate extending between the layer 12 and the dielectric layer 28.

In this representative embodiment of the prior art, the through-vias 18 and C4 or solder ball 22 formations and the contacts formed by means of the backside wire 20 are isolated from the silicon substrate 26, and no provision is made in this arrangement for any electrical contact being present between the bond pads 16 and the vias 18 and the silicon substrate 26, which may be optionally desirable or necessary in various physical and technological applications, as mentioned hereinbefore.

Figure 2:
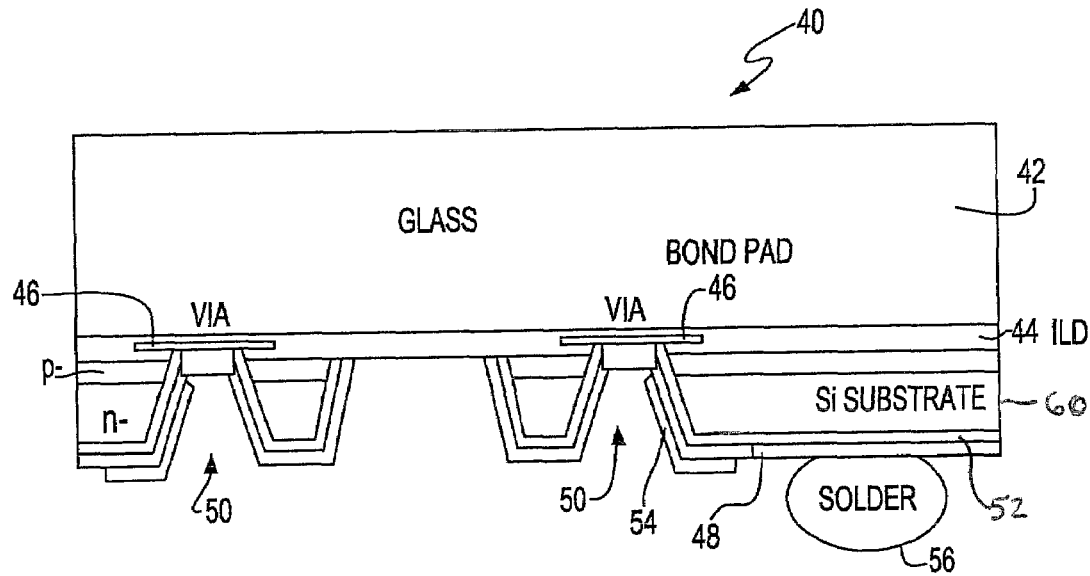
FIG. 2 illustrates a generally diagrammatic representation of a segment of a semiconductor chip scale package, possessing through-vias which are isolated from a silicon substrate and further through-vias which are connected to the silicon substrate in accordance with a first aspect of the present invention.

Reverting, in particular, to a chip scale package 40 constructed pursuant to the invention, as disclosed and illustrated in FIG. 2 of the drawings, as in FIG. 1, provided is a similar cover glass plate structure 42. A dielectric insulating layer 44 is provided with the inclusion of bond pads 46, which are in electrical communication with backside wires 48 extending through a series of through-vias 50, the latter of which may be tapered in cross-section so as to widen downwardly, and which electrically connect through the backside wires 48 extending between dielectric layers 52 and 54 into electrical contact with suitable solder balls 56 or C4 connections. As previously mentioned, a silicon substrate 60 is arranged between the insulating layer 44 and the dielectric layer 52.

However, in this instance, the through-via 50 represented towards the right-hand portion of the semiconductor chip scale package 40 is electrically isolated from the substrate 60, whereby the dielectric material 52 covers only one side of the backside wire 48 and electrical terminals and the second dielectric 54 covers the other side of the backside wire 48 extending from the bond pad 46 and the surface of the through-via 50 to the solder ball 56.

In this instance, as represented towards the left-hand side in FIG. 2 of the drawings, the bond pad 46 is connected by means of electrical connections formed in the through-via 50 to the silicon substrate 60, the latter of which has an upper p− type and a lower n− type layer, in effect, being constituted of a doped silicon material; respectively, a Group III A element and a Group V A element doped silicon. Hereby, the through-via 50 provides for electrical connections with the silicon substrate material.

Figure 3:
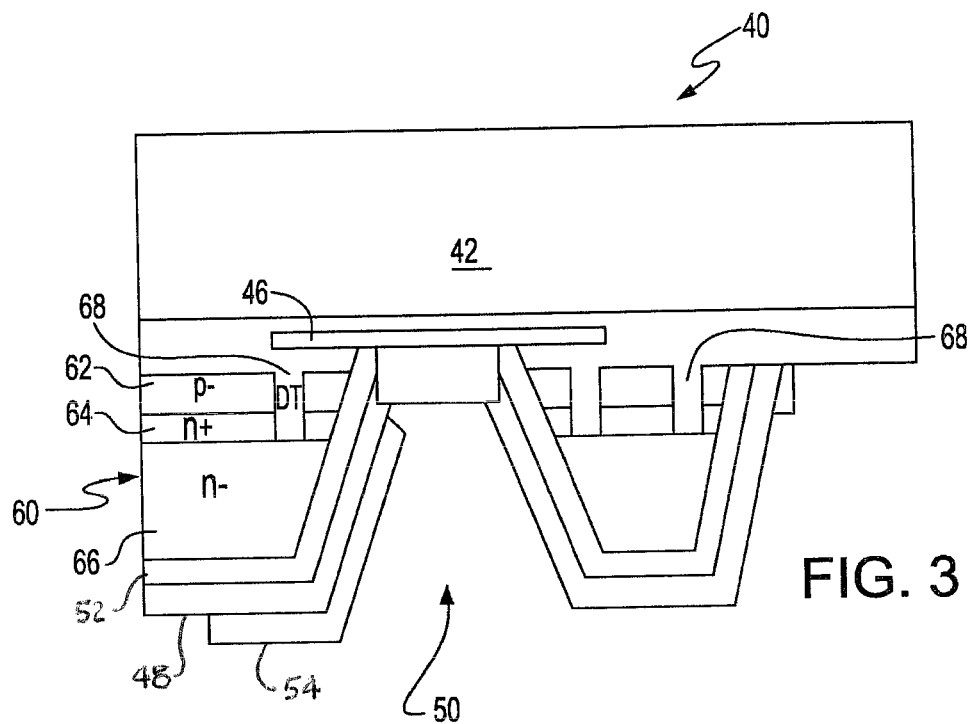
FIG. 3 illustrates, on an enlarged scale, the arrangement of FIG. 2, with a deep trench being formed in the silicon substrate to provide an isolation between a p– epi silicon layer and an electrical contact.

As indicated in an enlarged scale in FIG. 3 of the drawings, in that instance, the via 50, which may be the left via illustrated in FIG. 2 of the drawings, is electrically connected to the substrate 60, however, in this instance, there is provided for isolation between a p− layer 62 of the silicon substrate 60 and an n+ layer 64 therebeneath, and an n− lower layer 66 by means of a deep trench 68 (DT), resulting in isolation between the p− epi layer and an electrical contact (not shown). However, the through-via 50 is provided with an electrical contact to the silicon substrate 60.

Figure 4:
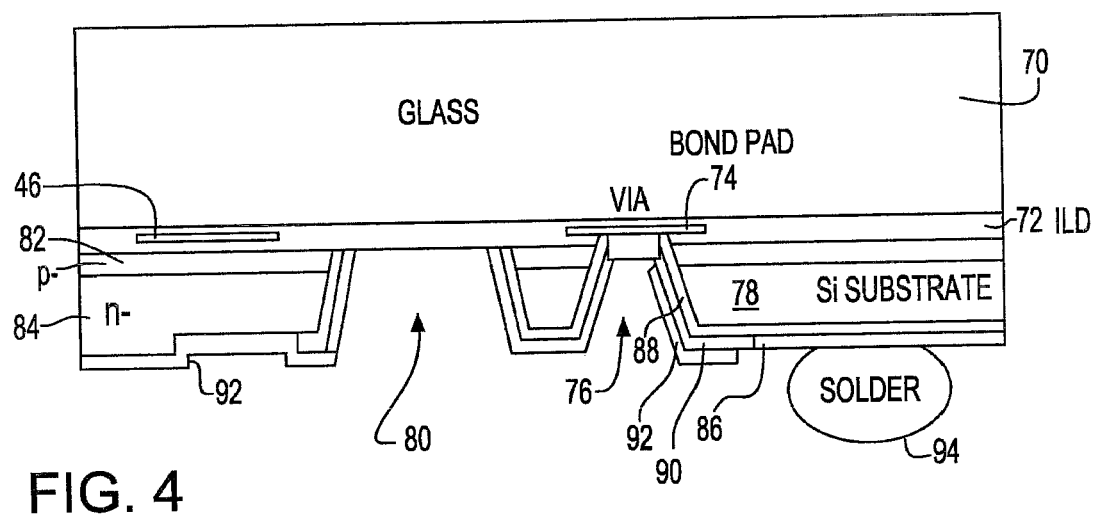
FIG. 4 illustrates, generally diagrammatically, an arrangement pursuant to the invention showing a semiconductor chip scale package in a modification of the chip scale package represented in FIG. 2 of the drawings.

Finally, referring to FIG. 4 of the drawings, in this instance, the glass cover 70 is located above a further layer 72 containing a bond pad 74, which provides for a through via 76 isolated from the silicon substrate 78, similar to that illustrated in FIG. 2 of the drawings. A further via 80, which connects electrically, is wider in size than the preceding via 76, and is electrically connected to the substrate 78 by means of a p− layer 82 arranged above an n− layer 84 of doped silicon material. In that instance, the terminal backside wire 86 extends through between dielectric layers 88 and 90 down towards a contact surface or wire 92, which may have suitable solder balls 94 or C4 connects provided thereon.

From the foregoing, it becomes readily apparent to one skilled in the art that the present invention advantageously discloses semiconductor chip scale packages possessing both through-vias which are isolated from a silicon substrate and also through-vias which are electrically in contact or connection with the silicon substrate material, and which imparts a versatility to the package in comparison with those presently employed in the state-of-the-technology.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A semiconductor chip scale package including a plurality of through-vias, which are selectively electrically isolated from or electrically connected with a silicon substrate having said through-vias formed therein, a glass cover being superimposed on said silicon substrate; a dielectric layer being interposed between said glass cover and said silicon substrate; bond pads being arranged within said dielectric layer in electrical connection with contacts on an opposite surface of said silicon substrate, wherein said opposite surface of said silicon substrate includes backside wires extending between said bond pads in said dielectric layer and said contacts so as to provide the electrical connections therebetween; wherein said silicon substrate comprises superimposed doped silicon p−, n+ and n-layers; wherein said n+ layer is interposed between said p− and n− layers so as to ensure an ohmic contact is achieved with the silicon substrate; and wherein said silicon substrate incorporates deep trenches (DT) providing isolation between the p− layer and said contacts.

2. A semiconductor chip scale package as claimed in claim 1, wherein said contacts comprise solder balls.

3. A semiconductor chip scale package as claimed in claim 1, wherein said contacts comprise C4 connects.

4. A method of providing a semiconductor chip scale package including a plurality of through-vias, which are selectively electrically isolated from or electrically connected with a silicon substrate having said through-vias formed therein, superimposing a glass cover on said silicon substrate; a dielectric layer is interposed between said glass cover and said silicon substrate; and bond pads are arranged within said dielectric layer in electrical connection with contacts on an opposite surface of said silicon substrate, and providing said opposite surface of said silicon substrate with backside wires extending between said bond pads in said dielectric layer and said contacts so as to provide the electrical connections therebetween, wherein said silicon substrate comprises superimposed doped silicon p−, n+ and n-layers, wherein said n− layer is interposed between said p− and n− layers so as to ensure an ohmic contact is achieved with the silicon substrate; and wherein said silicon substrate incorporates deep trenches (DT) providing isolation between the p− layer and said contacts.

5. A method as claimed in claim 4, wherein said contacts comprise solder balls.

6. A method claimed in claim 4, wherein amid contacts comprise C4 connects.

\* \* \* \* \*